(12) United States Patent
Umetani

(10) Patent No.: US 9,019,000 B2
(45) Date of Patent: Apr. 28, 2015

(54) DRIVER CIRCUIT HAVING A STORAGE DEVICE FOR DRIVING SWITCHING DEVICE

(71) Applicant: Denso Corporation, Kariya, Aichi-pref. (JP)

(72) Inventor: Kazuhiro Umetani, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/163,330

(22) Filed: Jan. 24, 2014

(65) Prior Publication Data

US 2014/0285241 A1    Sep. 25, 2014

(30) Foreign Application Priority Data

Mar. 22, 2013    (JP) .................................. 2013-59959

(51) Int. Cl.
  *H03K 17/16*    (2006.01)
(52) U.S. Cl.
  CPC .................................... *H03K 17/162* (2013.01)
(58) Field of Classification Search
  CPC .................................................... H03K 17/162
  USPC ......... 327/109, 108, 110, 111, 379, 384, 389, 327/390, 391, 427, 434, 589
  See application file for complete search history.

(56) References Cited

U.S. PATENT DOCUMENTS

| | | | |
|---|---|---|---|
| 6,072,353 A * | 6/2000 | Matsuzawa | .................... 327/390 |
| 2009/0015224 A1 | 1/2009 | Hirao et al. | |
| 2009/0033377 A1 | 2/2009 | Hashimoto et al. | |
| 2010/0141304 A1 | 6/2010 | Miyazaki | |

FOREIGN PATENT DOCUMENTS

JP    2009-200891 A    9/2009

* cited by examiner

*Primary Examiner* — Jung Kim
(74) *Attorney, Agent, or Firm* — Posz Law Group, PLC

(57) ABSTRACT

A driver circuit for a semiconductor switching device includes a drive power source, a capacitor and four switches, which form a bridge circuit. The capacitor is provided between the four switches. In one cycle of application of a voltage to a gate of the semiconductor switching device to turn on the semiconductor switch, the first and the second switches, which are diagonal, are turned off and the third and the fourth switches, which are diagonal, are turned on to charge the capacitor. Then only the first switch is turned on to apply the voltage to the gate, and lastly only the second switch is turned on to discharge the capacitor thereby to apply a negative voltage to the gate of the semiconductor switching device.

13 Claims, 10 Drawing Sheets

DRIVER CIRCUIT HAVING A STORAGE DEVICE FOR DRIVING SWITCHING DEVICE

CROSS REFERENCE TO RELATED APPLICATION

This application is based on and incorporates herein by reference Japanese patent application No. 2013-59959 filed on Mar. 22, 2013.

TECHNICAL FIELD

The present disclosure relates to a driver circuit for driving a semiconductor switching device, which conducts or shuts off a current, by application of a voltage, which is supplied directly or indirectly from a drive power source, to a control terminal of the semiconductor switching device.

BACKGROUND

As a semiconductor switch for a switching power source, for example, a next generation semiconductor switching device which has a low threshold voltage to be driven by a driver circuit with low DC voltage source is introduced recently. With the low threshold voltage, an erroneous operation tends to occur due to noise. For this reason, a driver circuit is required to suppress the erroneous operation. Such a driver circuit is configured typically with two switches. This driver circuit applies a positive voltage to a gate of the element by turning on one of the switches when the element is to be turned on. The driver circuit applies a negative voltage to the gate of the element by turning on the other of the switches when the element is to be turned off. According to this configuration, a gate voltage at the time of turning off largely deviates from the threshold voltage potential. As a result, even when the noise generated at the time of switching is superimposed to the gate, the erroneous operation (erroneous turning on), which will be caused by the noise, can be restricted from occurring.

The driver circuit, however, needs a power source circuit which provides a negative power source in addition to a power circuit which provides a positive power source. It is thus difficult to reduce a size of an entire circuit and reduce manufacturing cost. To address the problem, a driver circuit which is capable of generating a negative voltage in its operation, is proposed in, for example, JP 4682173.

The driver circuit of this configuration turns on one of its switches when a semiconductor switching device, which is a control object, is to be turned on. The driver circuit thus forms a current flow path which extends from a high-potential side output terminal of a drive power source to a gate of the semiconductor switching device through the turned-on switch. At this time, the gate of the semiconductor switching device is supplied with a voltage, which is equal to a voltage (power source voltage) of the drive power source. The driver circuit turns on two switches when the semiconductor switching device is to be turned off. The driver circuit thus forms a current flow path which extends from the gate of the semiconductor switching device to a low-potential side output terminal of the drive power source through the two switches and a capacitor. At this time, the capacitor is charged with electricity equivalent to the power source voltage. Hence, the gate of the semiconductor switching device is supplied with a negative voltage, absolute value of which is equal to the power source voltage. To summarize, the driver circuit described above operates with a power source and still can thus apply to the gate of the semiconductor switching device the positive and negative voltages having the absolute values equal to the power source voltage.

The driver circuit configured as described above has one switch in the current flow path (gate charge path) which extends to the gate of the semiconductor switching device when the semiconductor switching device is turned on. The driver circuit has two switches in the current flow path (gate discharge path) which extends to the gate of the semiconductor switching device when the semiconductor switching device is turned off. This driver circuit thus includes three switches for passing the gate charge electricity and the gate discharge electricity, whereas the driver circuit having the typical configuration described above has two switches for passing the gate charge electricity and the gate discharge electricity. Consequently, the driver circuit having the above-described configuration needs one more switch for charging and discharging the gate relative to the driver circuit of the typical configuration.

In driving the semiconductor switching device, it is necessary to change the gate potential of the semiconductor switching device at high speeds to realize high speed switching operations. When the gate potential is changed at high speeds, the currents for charging and discharging the gate increase relatively. Therefore, the switches provided in the gate charge path and the gate discharge path are required to allow sufficiently large currents for charging and discharging. Thus the switches are necessarily designed to have large current supply capability.

For those reasons, the number of switches provided in the gate charge path and the gate discharge path in the driver circuit is a very important factor to determine a circuit occupying area (semiconductor chip area when integrated). If the number of the switches provided in the gate charge path and the gate discharge path increases as in the driver circuit described above, the circuit occupying area need be increased and hence the manufacturing cost will increase.

SUMMARY

It is therefore an object to suppress increase of a circuit occupying area and restrict a noise-caused erroneous operation in a driver circuit for driving a semiconductor switching device which drives the semiconductor switching device by using a voltage supplied from one drive power source.

According to one aspect, a driver circuit is provided for driving a semiconductor switching device by applying to a control terminal of the semiconductor switching device a voltage supplied directly or indirectly from a drive power source. The driver circuit comprises a first semiconductor switch having a function of conducting and shutting off a current of at least one direction, a second semiconductor switch having a function of conducting and shutting off a current of at least one direction, and a storage device having a charge storage function and chargeable by the drive power source through a first charge path and a second charge path.

One output terminal of the drive power source is connected to one current on/off terminal of the semiconductor switching device. The first semiconductor switch is provided in a path, which connects the other output terminal of the drive power source and the control terminal. The storage device is provided in a path, which connects the control terminal and one terminal of the second semiconductor switch. The second semiconductor switch is connected in a path, which connects the storage device and the one output terminal of the drive power source. The first charge path is a current supply path, which connects the other output terminal of the drive power source and the control terminal through the storage device.

The second charge path is a current supply path, which connects the control terminal and the one output terminal of the drive power source. The voltage is applied to the control terminal of the semiconductor switching device in each cycle of voltage application. The cycle includes a first state for turning on the first semiconductor switch and turning off the second semiconductor switch and a second state for turning off the first semiconductor switch and turning on the second semiconductor switch. The cycle further includes a third state for turning off the first semiconductor switch and the second semiconductor switch at least once in a predetermined period, which includes a period of application of the voltage to the control terminal of the semiconductor switching device.

DETAILED DESCRIPTION OF THE EMBODIMENT

Figure 1:
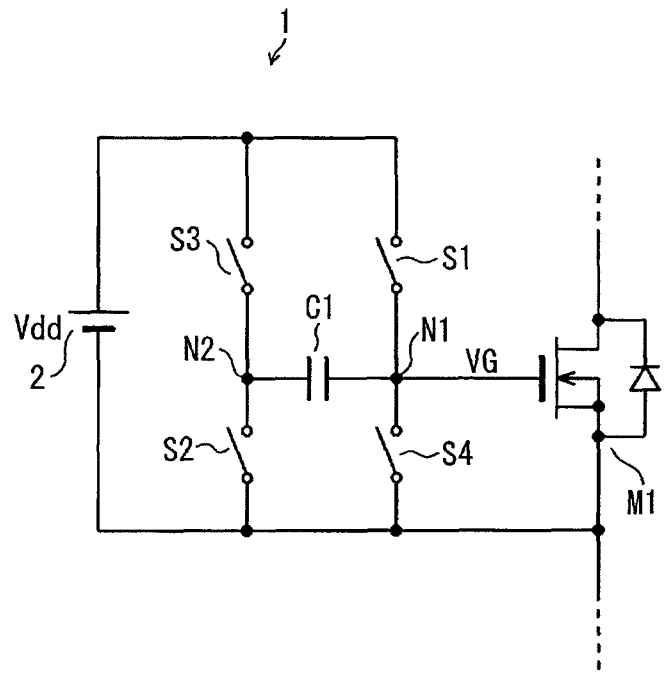
FIG. 1 is a circuit diagram showing schematically a driver circuit according to a first embodiment.

A driver circuit will be described in detail with reference to plural embodiments shown in the drawings. In each embodiment, substantially same parts are designated with same reference numerals.

(First Embodiment)

A first embodiment of a driver circuit will be described with reference to FIG. 1 to FIG. 10. A driver circuit 1 shown in FIG. 1 drives a semiconductor switching device M1, which conducts and shuts off a current supplied to a load, which is not shown. The semiconductor switching device M1 is a power MOSFET, which is GaN-HEMT (gallium nitride high-electron-mobility transistor). The power semiconductor switching device of GaN-HENT has high withstand voltage and low on-resistance and is capable of high speed switching. For this reason, the power semiconductor switching device is expected to contribute to circuit size reduction and high operation efficiency. However, the power semiconductor switching device generally has a low threshold voltage in comparison to IGBT and Si-MOSFET. As a result, it is likely to operate erroneously due to noise generated at the time of switching. As described later, the driver circuit 1 solves the above-described problem by a simple circuit (drive method) without using highly complicated drive method.

The driver circuit 1 applies a voltage, which is supplied directly or indirectly from a drive power source 2, to a gate (control terminal) of the semiconductor switching device M1. The driver circuit 1 includes switches S1 to S4 and a capacitor C1 (charge storage device). The switch S1 and the switch S2 are semiconductor switches (on/off switches) which correspond to a first semiconductor switch and a second semiconductor switch, respectively. Each of these semiconductor switches may be a reverse conducting switch, which conducts a current in a reverse direction irrespective of a state of the control terminal, a reverse blocking switch, which prevents a current from flowing in a reverse direction irrespective of the state of the control terminal, or a bidirectional switch, which is settable to conduct or prevent a current from flowing in a reverse direction in correspondence to the state of the control terminal. Each of the switches S3 and S4 is preferably a semiconductor switch (on/off switch), which is the reverse blocking switch or bidirectional switch.

The reverse conducting switch may be, for example, a MOSFET (metal-oxide semiconductor field effect transistor). The bidirectional semiconductor switches or the reverse blocking switches may be, for example, a BJT (bipolar junction transistor), a JFET (junction field effect transistor), an IGBT (insulated gate bipolar transistor) and the like. The reverse blocking switch may be, for example, a semiconductor switch connected in series with a diode. The bidirectional switch may be two MOSFETs, which are connected in series and in opposite directions (bidirectional switch). The switches S1 to S4 are turned on and off (on/off-controlled) by a control signal applied from a control circuit, which is not shown.

The drive power source 2 is a positive power source which outputs a positive voltage Vdd as a power source voltage. The voltage Vdd is higher than a threshold voltage (gate threshold value voltage) of the semiconductor switching device M1 and, for example, 5V. The high-potential side output terminal (other output terminal) of the drive power source 2 is connected not only to a node N1 through the switch S1 but also to a node N2 through the switch S3. The low-potential side output terminal (one output terminal) of the drive power source 2 is connected not only to the node N1 through the switch S4 but also to the node N2 through the switch S2. The low-potential side output terminal of the drive power source 2 is connected to the source (one current on/off terminal) of the semiconductor switching device M1.

The node N1 is connected to the gate of the semiconductor switching device M1. The node N1 and the gate of the semiconductor switching device M1 may be connected through a gate resistor (not shown). The capacitor C1 is connected between the node N1 and the node N2. In the driver circuit 1, four switches S1 to S4 are arranged diagonally to form a bridge circuit. Specifically, the switches S1 and S2 are diagonal to each other, and the switches S3 and S4 are diagonal to each other. The capacitor C1 is provided to connect intermediate points (nodes N1 and N2), at which the switches of the bridge circuit are connected in series. Here, the terminals of the capacitor C1 on the node N2 side and the node N1 side are referred to as the one terminal and the other terminal, respectively.

In the above-described configuration, a first charge path is formed as a current flow path extending from the high-potential side output terminal of the drive power source 2 to the node N1 (gate of the semiconductor switching device M1) through the switch S3 and the capacitor C1. A second charge path is formed as a current flow path extending from the node N1 to the low-potential side output terminal of the drive power source 2 through the switch S4. As described later, the capacitor C1 is charged by the drive power source 2 through the first charge path and the second charge path. The driver circuit 1 is designed such that a resistance value R1 of an electric resistance (current flow resistance) of the first charge path is higher than a resistance value R2 of an electric resistance of the second charge path (R1>R2).

As described above, the switches S3 and S4 are each formed of the revers blocking semiconductor switch or bidirectional semiconductor switch. Specifically, the switches S3 and S4 are connected in such a manner to attain the following operations. The switch S3 conducts or shuts off a current (current charging the capacitor C1) which flows from the terminal on the drive power source 2 side toward the terminal on the node N2 side. The switch S3 further shuts off a current (current flowing in reverse to the charging current) which flows from the terminal on the node N2 side toward the terminal on the drive power source 2 side. The switch S4 conducts or shuts off a current (current charging the capacitor C1) which flows from the terminal on the node N1 side toward the terminal on the drive power source 2 side. The switch S4 further shuts off a current (current flowing in reverse to the charging current) which flows from the terminal on the drive power source 2 side toward the terminal on the node N1 side.

Figure 2:
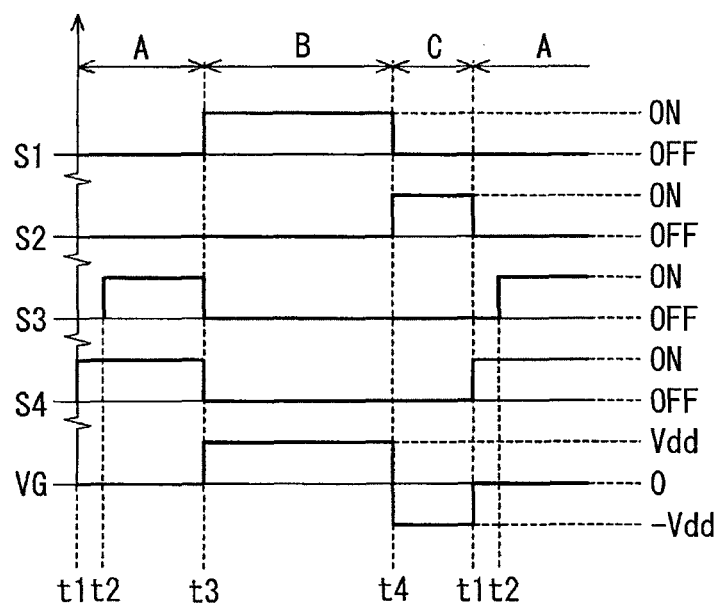
FIG. 2 is a time chart showing on/off states of switches and voltage waveforms in the driver circuit.

A driving operation of the driver circuit 1, which is configured as described above, for the semiconductor switching device M1 will be described next. As shown in FIG. 2, one cycle of applying of the voltage to the gate of the semiconductor switching device M1 has three time periods A (time t1 to t3), B (time t3 to t4) and C (time t4 to t1) in this order. In those periods A, B and C, on/off states of the switches S1 to S4 are different one another. The period A (corresponding to a third state) is an interval when applying a zero voltage (0V) to the gate of the semiconductor switching device M1 to turn off the semiconductor switching device M1 and charging the capacitor C1.

In the period A, the switches S1 and S2 are turned off (opened) and the switches S3 and S4 are turned on (closed). Thus the gate and source terminals of the semiconductor switching device M1 are short-circuited by the switch S4, which is turned on. That is, the zero voltage (0V) is applied between the gate and source terminals of the semiconductor switching device M1 (VG=0V) and the semiconductor switching device M1 is driven to the off-state.

At this time, the capacitor C1 is connected in parallel to the drive power source 2 through the first charge path and the second charge path. The capacitor C1 is thus charged to the voltage Vdd in the period A. One terminal of the capacitor C1 becomes the positive side and its voltage is Vdd. The other terminal of the capacitor C1 becomes the negative side and its voltage is 0V.

The period B (corresponding to a first state) is an interval for applying the positive voltage (5V=Vdd) to the gate of the semiconductor switching device M1 to turn on the semiconductor switching device M1. In the period B, the switch S1 is turned on and the switches S2 to S4 are turned off. Thus the gate of the semiconductor switching device M1 is connected to the high-potential side output terminal of the drive power source 2 through the switch S1. The source of the semiconductor switching device M1 is connected to the low-potential side output terminal of the drive power source 2. Hence, the positive voltage Vdd is applied between the gate and source terminals of the semiconductor switching device M1 (VG=Vdd) and the semiconductor switching device M1 is driven to the on-state.

The period C (corresponding to a second state) is an interval for applying the negative voltage (−5V=−Vdd) to the gate of the semiconductor switching device M1 to turn off the semiconductor switching device M1. In the period C, the switch S2 is turned on and the switches S1, S3 and S4 are turned off. Thus the one terminal (positive side) of the capacitor C1 is connected to the low-potential side output terminal (source of the semiconductor switching device M1) of the drive power source 2 through the switch S2. The gate of the semiconductor switching device M1 is connected to the other terminal (negative side) of the capacitor C1. The negative voltage Vdd is thus applied between the gate and source terminals of the semiconductor switching device M1 (VG=−Vdd) and the semiconductor switching device M1 is driven to the off-state.

As described in the description of background technology, the semiconductor switching device M1 is likely to operate erroneously (erroneously turned on) due to switching noise generated immediately after turn-off, when the threshold voltage of the semiconductor switching device M1, which is the drive object, is low. In the present embodiment, therefore, as shown in FIG. 2, the negative voltage is applied to the gate during the interval (period C), which is from a turn-off start time point (time t4) to a time point (time t1) of an elapse of a predetermined time interval from the turn-off start time. Since the gate voltage VG becomes sufficiently deviated from the threshold voltage until the switching noise generated immediately after the turn-off is attenuated, it is possible to prevent occurrence of the erroneous operation. As described above, the period C for applying the negative voltage to the gate to turn off the semiconductor switching device M1 is provided next to and following the period B, which is for applying the positive voltage to the gate to turn on the semiconductor switching device M1.

The period A starts again after the negative voltage is applied to the gate in the period C. In the period A, the zero voltage is applied to the gate of the semiconductor switching device M1 so that the capacitor C1 is charged while maintaining the semiconductor switching device M1 in the off-state. Since the capacitor C1 absorbs electric charge stored in a parasitic capacitor of the gate and charge stored in itself naturally leaks (electric leakage), it is necessary to charge the capacitor C1 periodically. The period A for charging the capacitor C1 is provided in each cycle of voltage application to the gate of the semiconductor switching device M1. Thus the capacitor C1 is maintained in an appropriately charged state throughout operation.

When the capacitor C1 has sufficient capacitance, it need not be charged so frequently, that is, in each voltage application cycle. In such a case, the period A may be provided only in one of plural cycles for applying the voltage to the gate of the semiconductor switching device M1. If the number of times of the period A is reduced, the period C for applying the negative voltage to the gate may be provided in place of the period A in the cycle, in which the period A is not provided. The interval between the periods A may be determined based on various conditions such as circuit parameters, which include, for example, a static capacitance value of the capacitor C1, a voltage value Vdd of the drive power source 2 and a gate parasitic capacitance value of the semiconductor switching device M1 to be driven. The various conditions may include a limit, to which a terminal voltage of the capacitor C1 is allowed to change (fall) in the period C.

In the period A, in which the switches S3 and S4 are turned on, the electric charge current for the capacitor C1 flows in the second charge path including the switch S4. The second charge path causes a certain voltage drop. The voltage at the node N1, that is, the gate voltage of the semiconductor switching device M1 rises from the zero voltage by an amount corresponding to the voltage drop. When the amount of rise of the gate voltage is too large, the gate voltage reaches the threshold voltage and tends to turn on the semiconductor switching device M1 erroneously. For minimizing the amount of rise of the gate voltage, the switch S4 is designed to have preferably a relatively small on-resistance.

The on-resistance cannot be reduced to zero even if it is preferably small. Further, since the second charge path also has a resistance component such as a wire resistance in addition to the switch S4, influence of such a resistance component is not negligible. It is therefore difficult to reduce the amount of rise of the gate voltage completely to zero. However the amount of rise of the gate voltage can be reduced as much as possible as follows.

That is, as expressed by the following equation (1), a sum of a voltage drop VS3 in the first charge path including the switch S3 and a voltage drop VS4 in the second charge path including the switch S4 equals a difference between the voltage Vdd of the drive power source 2 and the inter-terminal voltage Vc of the capacitor C1 in the period A.

$$VS3+VS4=Vdd-Vc$$

In this equation, because the right side is assumed to be a fixed value, the voltage drop VS4 of the second charge path decreases responsively to an increase of the voltage drop VS3 of the first charge path in the left side. As described above, the resistance value R2 of the electric resistance of the second charge path is set to be smaller relative to the resistance value R1 of the electric resistance of the first charge path. With this setting, the voltage drop VS4 in the second charge path becomes relatively small and hence the amount of rise of the gate voltage in the period A can be reduced sufficiently small.

For setting the resistance value R2 of the electric resistance of the second charge path relatively smaller than the resistance value R1 of the electric resistance of the first charge path, the resistance values of wires of the first charge path and the second charge path may be adjusted. The resistance value R2 may also be set smaller relative to the resistance value R1 as follows. That is, a chip area of a semiconductor device (for example, MOSFET) of the switch S3 may be designed to be smaller than that of a semiconductor device of the switch S4. According to this design, since the resistances (on-resistances), which are exhibited when the semiconductor devices of the switches S3 and S4 are turned on, differ from each other, it is possible to set the relation of the resistance values R1 and R2 as described above. Alternatively, it is also possible to add resistors in the first charge path and the second charge path to set the relation of the resistance values R1 and R2 as described above.

As shown in FIG. 2, the switches S3 and S4 are turned on and off generally synchronously. However, the on-periods of the switches S3 and S4 are not necessarily identical. Specifically, the start time point t2 of the on-period of the switch S3 is slightly delayed from the start time point t1 of the on-period of the switch S4. This delay is provided for the following reason.

If the switch S3 is closed in advance of turn-on (closing) of the switch S4 when the switches S3 and S4 are turned on for transition to the period A (at the start of the period A), the following problem arises. That is, in the transition period in which the switch S3 is in the on-state and the switch S4 is in the off-state, the potential at the one terminal of the capacitor C1 is fixed to the voltage Vdd through the switch S3, which is turned on. As a result, a differential voltage between the voltage Vdd of the drive power source 2 and the terminal voltage of the capacitor C1 is applied to the gate of the semiconductor switching device M1. If the capacitor C1 is in the fully-charged state (charged to the voltage Vdd), the voltage applied to the gate is 0V. If the capacitor C1 is not in the fully-charged state, a voltage is applied to the gate. If the applied voltage is in excess of the threshold voltage, the semiconductor switching device M1 is likely to operate (turn on) erroneously.

In the present embodiment, however, the switch S4 is driven to turn on in advance to driving the switch S3 to turn on at the start time of the period A. For this reason, the gate potential of the semiconductor switching device M1 is fixed to zero voltage at the start time point of turn-on of the switch S4. Consequently, the semiconductor switching device M1 is prevented from erroneously turning on in the period A.

In the period B, the potential of the other terminal (low-potential side terminal) of the capacitor C1 is fixed to the voltage Vdd through the switch S1, which is turned on. The capacitor C1 has already been charged to the voltage Vdd in the period A. The voltage of the one terminal (high-potential side terminal) of the capacitor C1 rises to a high voltage (Vdd+Vc≈2×Vdd), which is higher than the voltage Vdd, in the period B. In this stage, if the switch S3 is a reverse conducting semiconductor switch, the electric charge of the capacitor C1 may be discharged through a path which is from the positive pole side of the capacitor C1 to the negative pole side through the switch S3 and the turned-on switch S1. However, since the switch S3 is a reverse blocking semiconductor switch or a bidirectional semiconductor switch, the electric charge of the capacitor C1 is prevented from being discharged in such a path in the period B.

In the period C, the potential of the one terminal (high-potential side terminal) of the capacitor C1 is fixed to zero voltage (0V) through the switch S2, which is turned on. The capacitor C1 has already been charged to the voltage Vdd in the period A. As a result, the voltage at the other terminal (low-potential side terminal) of the capacitor C1 is a voltage (0−Vc≈−Vdd), which is lower than zero voltage. In this state, if the switch S4 is a reverse conducting semiconductor switch, the electric charge of the capacitor C1 may be discharged in the path which is from the positive pole side of the capacitor C1 to the negative pole side through the turned-on switch S2 and the switch S4. However, since the switch S4 is a reverse blocking semiconductor switch or a bidirectional semiconductor switch, the electric charge of the capacitor C1 is prevented from being discharged in such a path in the period C.

As described above, since the driver circuit 1 according to the first embodiment uses only one drive power source 2, which is a positive power source for outputting a positive voltage, without using positive and negative drive power sources, voltages of both positive and negative polarities can be applied to the gate of the semiconductor switching device M1. As a result, the voltage applied to the gate for turning off the semiconductor switching device M1 largely deviates from the threshold voltage; even when the noise generated at the time of switching operation are superimposed to the gate, the semiconductor switching device M1 is protected from operating (turning on) erroneously due to such noise. That is, the first embodiment provides the same advantage as in the case, in which both positive and negative drive power sources are used.

In addition, the semiconductor switch provided in the gate charge supply path to the gate of the semiconductor switching device M1, is only the switch S1, when the switch M1 is turned on (period B). The semiconductor switch provided in the gate discharge path from the gate of the semiconductor switching device M1, is only the switch S2, when the semiconductor switching device M1 is turned off (period C). That is, the driver circuit 1 configured as above is provided with two semiconductor switches, which are used to charge and discharge the gate. As a result, according to the driver circuit 1, the circuit occupying area is suppressed from increasing and the manufacturing cost is suppressed from increasing. Since the circuit occupying area is decreased, circuit elements of the driver circuit 1 can be arranged compactly. As a result, lengths of wirings (particularly the lengths of wiring for gating the semiconductor switching device M1) which connect the circuit elements can be shortened and hence noise-withstanding performance can be improved further.

The semiconductor switching device M1, which is to be driven, is the power MOSFET of GaN-HEMT, the threshold of which is relatively low. For this reason, the driver circuit 1, which provides the advantage that the erroneous turn-on due to noise can be prevented by the comparatively simple circuit configuration and drive method, is very advantageous for industrial application of GaN-HEMT. Further, since the gate need be charged and discharge within a short period in a high-speed switching operation, which is an advantage of GaN-HEMT, a large current tends to flow in the driver circuit 1 at the moment of switching operation. For this reason, the semiconductor switch for use in the driver circuit 1 needs to withstand the large current and costs high. The driver circuit 1, which is configurable with less number of semiconductor switches, is very advantageous in respect of reduction of cost for applying the power semiconductor switching device of GaN-HEMT.

It is likely that the capacitor C1 has already been discharged at the time immediately after the electric power supply to the driver circuit 1 is turned on. If the switches S3 and S4 are turned on in the state in which the capacitor C1 has been discharged, an excessively large rush current is likely to flow through the switches S3 and S4. The switches S3 and S4 therefore need to withstand such a rush current.

Although the driver circuit 1 uses the drive power source 2 which is the positive power source for outputting the positive voltage, a driver circuit which uses a negative power source (drive power source) for outputting a negative voltage can also be formed in the same configuration as the driver circuit 1. Even in such a case, the on/off time points of the switches S1 to S4 (operation sequence of the driver circuit) are the same as those shown in FIG. 2.

However, the period B is now a period for turning off the semiconductor switching device M1 by application of a negative voltage to the gate. The period C is a period for turning on the semiconductor switching device M1 by application of a positive voltage to the gate. Therefore, in the case that the negative power source is used, voltage waveforms at various points are reversed in polarity compared to the voltage waveforms shown in FIG. 2.

Next, detailed exemplary configuration of the driver circuit 1 will be described with reference to FIG. 3 to FIG. 10. The driver circuits shown in FIG. 3 to FIG. 10 are designed for production as an integrated circuit. In FIG. 3 to FIG. 10, therefore, MOSFETs of the driver circuit are shown without illustration of body diodes (parasitic diodes).

Figure 3:
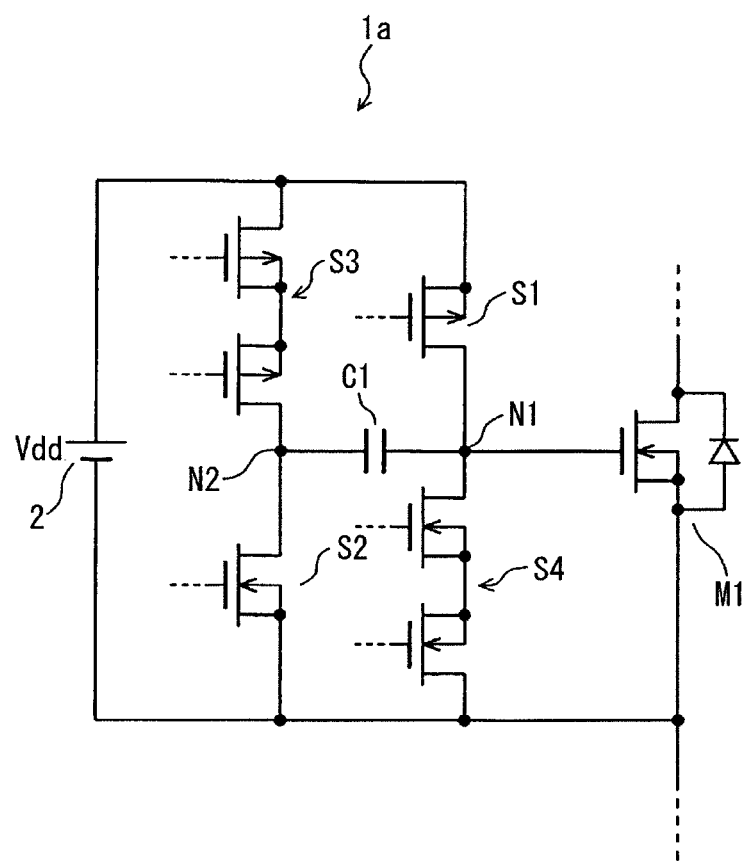
FIG. 3 is a circuit diagram showing a first detailed example of the driver circuit.
Figure 4:
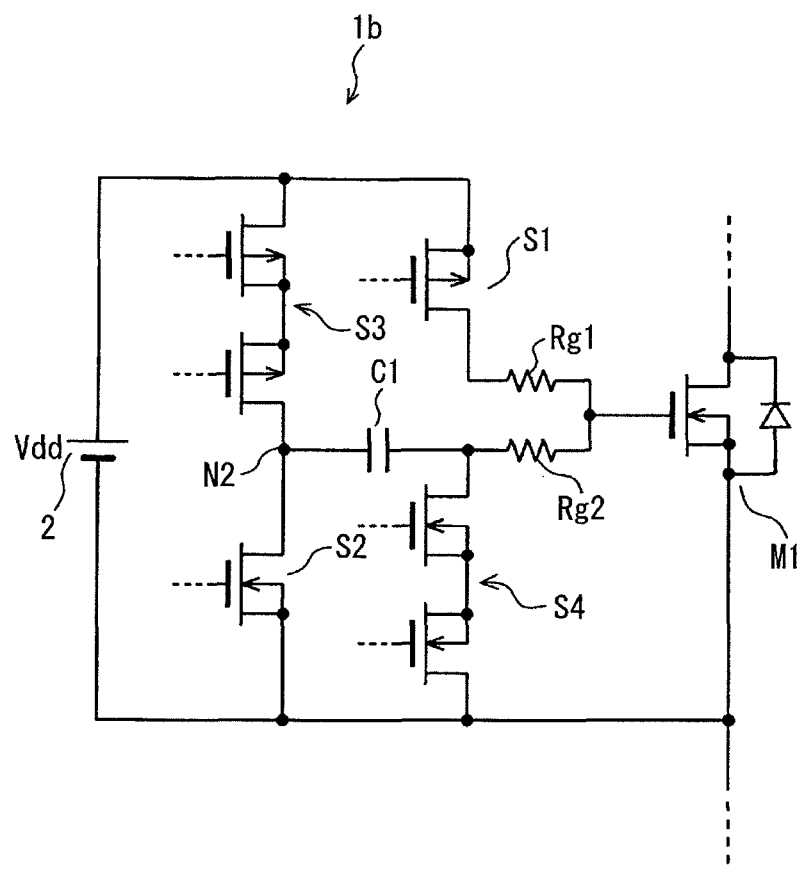
FIG. 4 is a circuit diagram showing a second detailed example of the driver circuit.
Figure 5:
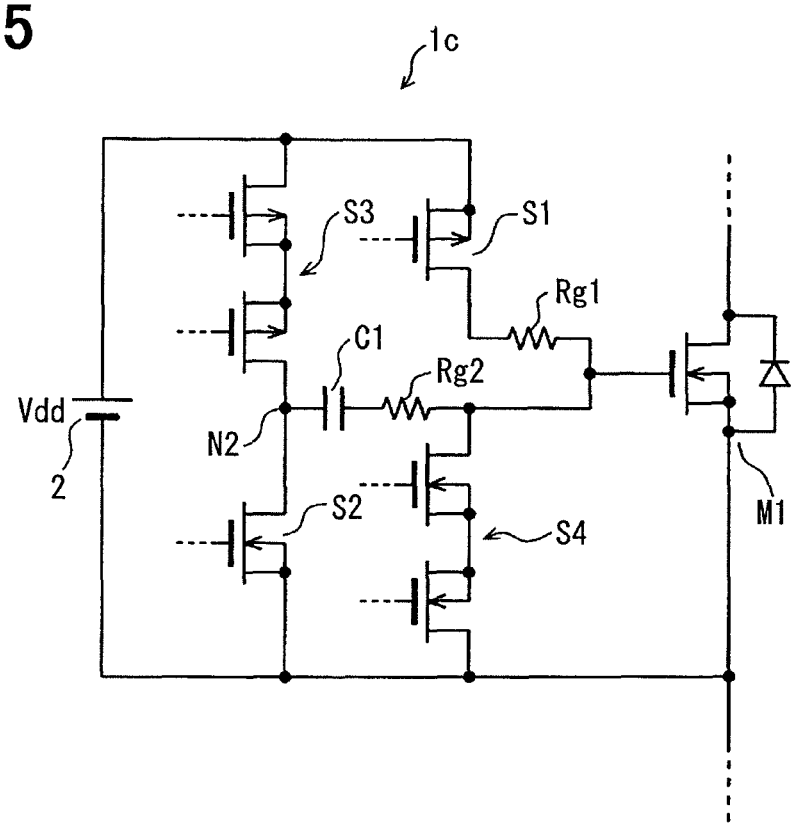
FIG. 5 is a circuit diagram showing a third detailed example of the driver circuit.

In a driver circuit 1a shown in FIG. 3, switches S1 to S4 are formed of MOSFETs. The switch S1 is a P-channel type MOSFET. The source of the switch S1 is connected to the high-potential side output terminal of the drive power source 2. The drain of the switch S1 is connected to the node N1. The switch S2 is an N-channel type MOSFET. The source of the switch S2 is connected to the low-potential side output terminal of the drive power source 2. The drain of the switch S2 is connected to the node N2.

The switch S3 is a bidirectional switch formed of two P-channel type MOSFETs which are connected in series in reverse directions. That is, the switch S3 is formed of two series-connected MOSFETs which can be controlled to turn on and off a current to flow in different directions from each other. The sources of the two MOSFETs of the switch S3 are connected to each other. The drain of one MOSFET of the switch S3 is connected to the high-potential side output terminal of the drive power source 2. The drain of the other MOSFET of the switch S3 is connected to the node N2.

The switch S4 is a bidirectional switch formed of two N-channel type MOSFETs which are connected in series in reverse directions. That is, the switch S4 is formed of two series-connected MOSFETs, which can be controlled to turn on and off a current to flow in different directions from each other. The sources of the two MOSFETs of the switch S4 are connected to each other. The drain of one MOSFET of the switch S4 is connected to the node N1. The drain of the other MOSFET of the switch S4 is connected to the low-potential side output terminal of the drive power source 2.

Since the driver circuit 1a shown in FIG. 3 uses MOSFETs as the switches S1 to S4, such a configuration is particularly advantageous for integrating the driver circuit 1a by the CMOS process and practical. The driver circuit 1a applies the positive voltage to the gate of the semiconductor switching device M1 in the period B and applies the negative voltage to the gate of the semiconductor switching device M1 in the period C. In a case that a normally-off type switching device is driven by the driver circuit 1a configured as described above, it is preferable to provide the period A or the period C immediately after the power supply from the drive power source 2. It is thus possible to maintain the semiconductor switching device M1 in the off-state stably even before the capacitor C1 is charged with the stabilized power source voltage. As described above, the driver circuit 1a is preferable in the case that the semiconductor switching device M1, which is the object to be driven, is the normally-off type switching device.

The above-described configuration has no resistor (gate resistor) between the driver circuit 1a (node N1) and the semiconductor switching device M1. However, a gate resistor may be provided. The gate resistor may be provided by inserting one resistor in, for example, a path extending from the node N1 to the gate of the semiconductor switching device M1. It is possible, as exemplified as a driver circuit 1b shown in FIG. 4, to provide a gate resistor for turning on the semiconductor switching device M1 and a gate resistor for turning off the semiconductor switching device M1 separately. In this configuration, the drain of the switch S1 is connected to the gate of the semiconductor switching device M1 through a gate resistor Rg1, which is provided for turning on the semiconductor switching device M1. The drain of the one MOSFET of the switch S4 is connected to the gate of the semiconductor switching device M1 through a gate resistor Rg2, which is provided for turning off the semiconductor switching device M1. With this configuration, it is possible to set different gate resistances for turning on and turning off, thereby increasing a degree of freedom in circuit design. In a case that the negative drive power source is used, the relation between turning on and turning off are reversed.

The gate resistor may be inserted in an arbitrary position as far as it is in the charge path and the discharge path to the gate of the semiconductor switching device M1. It is possible, as exemplified as a driver circuit 1c shown in FIG. 5, the position of insertion of the gate resistor for turning off may be changed. In this configuration, the gate resistor Rg2 for turning off is connected between the other terminal of the capacitor C1 and a junction between the drain of the one MOSFET of the switch S4 and the gate of the semiconductor switching device M1. That is, the gate resistor Rg2 is provided in the first charge path. For this reason, in the configuration of FIG. 5, the gate resistor Rg2 also functions as a current limiting resistor for limiting the charge current, which flows to charge the capacitor C1 in the period A. This configuration can reduce influence of the rush current, which the capacitor C1 receives immediately after the power supply to the driver circuit 1c is started. The gate resistor Rg2 further functions to increase the resistance R1 of the electric resistance of the first charge path relative to the resistance R2 of the electric resistance of the second charge path.

Although the driver circuits 1a to 1c use MOSFETs for the switches S1 to S4, the driver circuits 1a to 1c may use other switching devices. Each of the switches S1 to S4 may be a bipolar transistor (MT), JFET, IGBT and the like. It is possible to form each of the switches S3 and S4 by one device by using a bidirectional semiconductor switch or reverse blocking semiconductor switch such a as a bipolar transistor or an IGBT (that is, the switches S3 and S4 need not be bidirectional switch).

The switches S1 to S4, particularly the switches S3 and S4, may be reverse blocking semiconductor switches, each of which is formed as, for example, a series connection of a rectifier device and a MOSFET. The rectifier device is not limited to a diode only but includes a configuration, in which a MOSFET or a bipolar transistor is connected to operate as a diode. However, if the MOSFET is connected to operate as a diode, its well on the semiconductor chip need be connected to an appropriate potential so that no body diode is formed.

Figure 6:
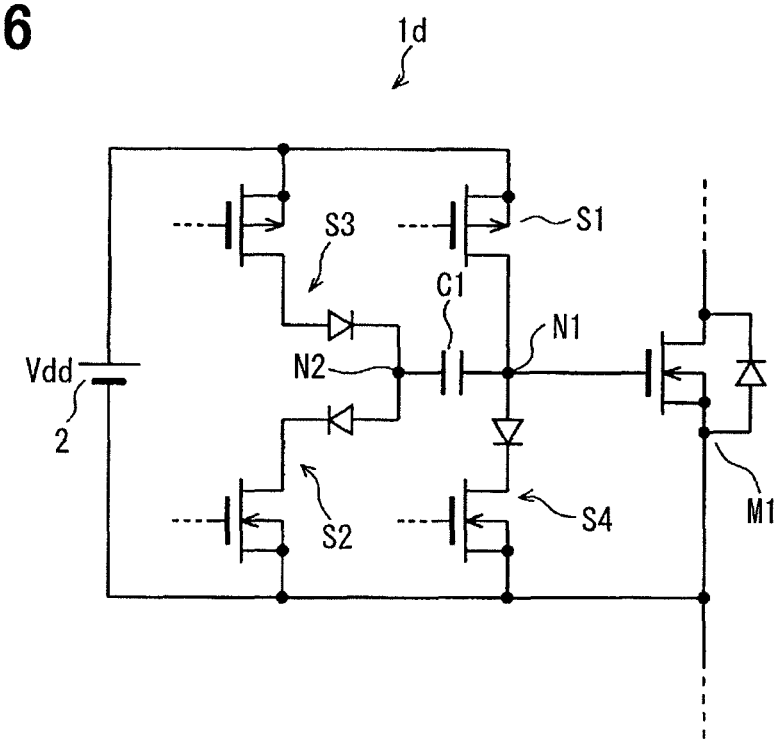
FIG. 6 is a circuit diagram showing a fourth detailed example of the driver circuit.

It is possible, as exemplified as a driver circuit 1d shown in FIG. 6, to configure each of the switches S2 to S6 by a rectifier device and a MOSFET. In this configuration, the switch S2 is formed of the N-channel MOSFET and the diode. The cathode of the diode of the switch S2 and the drain of the MOSFET are connected to each other. The anode of the diode forming the switch S2 is connected to the node N2. The source of the MOSFET of the switch S2 is connected to the low-potential side output terminal of the drive power source 2.

The switch S3 is formed of the P-channel MOSFET and the diode. The drain of the MOSFET of the switch S3 and the anode of the diode are connected to each other. The source of the MOSFET of the switch S3 is connected to the high-potential side output terminal of the drive power source 2. The cathode of the diode of the switch S3 is connected to the node N2. The switch S4 is formed of the N-channel type MOSFET and the diode. The cathode of the diode of the switch S4 and the drain of the MOSFET are connected to each other. The anode of the diode of the switch S4 is connected to the node N1. The source of the MOSFET of the switch S4 is connected to the low-potential side output terminal of the drive power source 2.

According to this configuration, the switches S2 to S4 are reverse blocking switches and hence the same operation and advantage are provided as those of the configurations described above. Further, this configuration has an advantage that the circuit occupying area is reduced relative to the configurations shown in FIG. 3 to FIG. 5, because one of the MOSFETs of the switches S3 and S4 is replaced with the diode. Since the switches S1 and S2 may be any of the reverse conducting switch, the reverse blocking switch and the bidirectional switch, the diode of the switch S2 may be eliminated in the configuration of FIG. 6.

It is also possible to insert a current limiting device such as a resistor in series with either one or both of the switches S3 and S4 to suppress the charge current for the capacitor C1. If such a current limiting device is provided, it is possible to form either one or both of the switches S3 and S4 by a rectifier device. As exemplified as a driver circuit 1e shown in FIG. 7, a current limiting device may be inserted in series with the switch S3 and the switch S3 may be formed of a diode. The cathode of the diode of the switch S3 is connected to the node N2. The anode of the diode of the switch S3 is connected to the high-potential side output terminal of the drive power source 2 through a resistor Rr1, which is the current limiting device.

Figure 8:
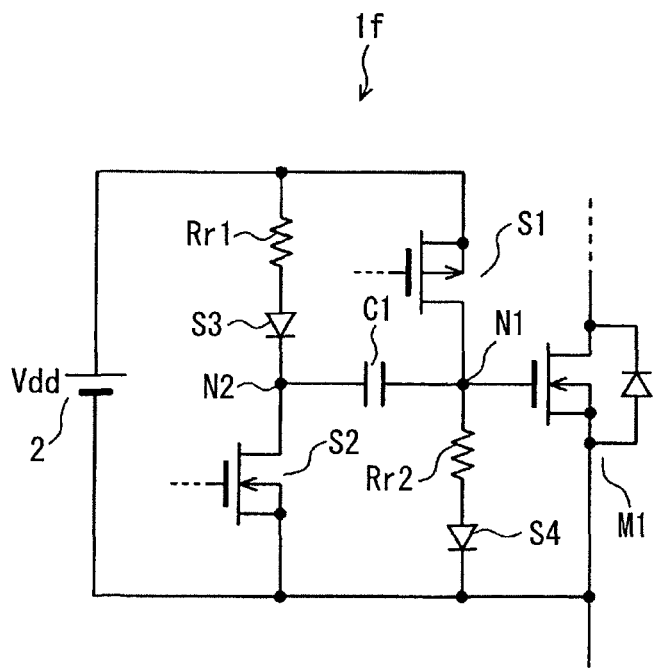
FIG. 8 is a circuit diagram showing a sixth detailed example of the driver circuit.

Further, as exemplified as a driver circuit 1f shown in FIG. 8, it is possible to insert resistors in series with the switches S3 and S4, respectively, and form both of the switches S3 and S4 by diodes. In this configuration, the cathode of the diode of the switch S4 is connected to the low-potential side output terminal of the drive power source 2. The anode of the diode of the switch S4 is connected to the node N1 through a resistor Rr2, which is a current limiting device.

Figure 7:
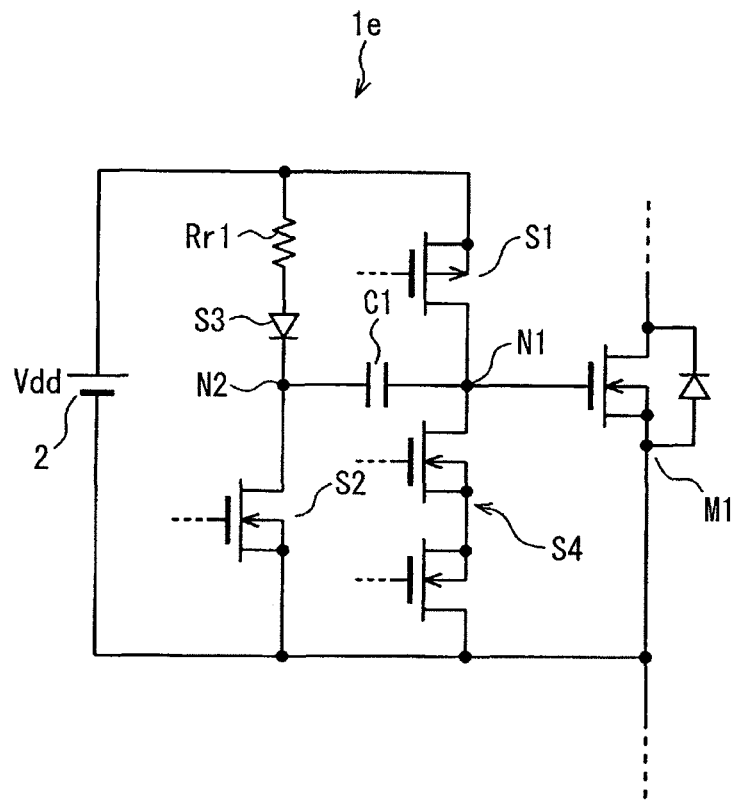
FIG. 7 is a circuit diagram showing a fifth detailed example of the driver circuit.

In the configurations shown in FIG. 7 and FIG. 8, the following points should be taken into consideration. That is, in the configurations of FIG. 7 and FIG. 8, when the switch S2 is turned on in the period C, a current flows through the resistor Rr1, the diode of the switch S3 and the switch S2, which is turned on. This current does not contribute to the operation required for the driver circuit and simply results in loss.

In addition, in the configuration of FIG. 8, the same problem arises in the period B. That is, in the configuration of FIG. 8, when the switch S1 is turned on in the period B, a current flows through the switch S1, which is turned on, the resistor Rr2 and the diode of the switch S4. This current also simply results in loss similarly to the current which flows in the period C. As far as the driver circuit is allowed to have such an increase of loss, either one or both of the switches S3 and S4 may be formed of a rectifier device. This configuration has an advantage that the circuit occupying area is reduced more compared to the configurations shown in FIG. 6, because one or two MOSFETs is eliminated.

In the configurations shown in FIG. 7 and FIG. 8, the switch S3 (specifically diode) may be eliminated. In this modification, one terminal of the resistor Rr1 is connected directly to the node N2. As a result, in addition to the above-described increase of loss, discharge of electricity of the capacitor C1, which is prevented by the reverse blocking characteristic of the switch S3, arises in the period B. Therefore, as far as the driver circuit is allowed to have such problems, the switch S3 itself can be eliminated in the configurations of FIG. 7 and FIG. 8.

In the configuration of FIG. 8, the switch S4 (specifically diode) may be eliminated. In this modification, one terminal of the resistor Rr2 is connected directly to the low-potential side output terminal of the drive power source 2. As a result, in addition to the above-described increase of loss, discharge of electricity of the capacitor C1, which is prevented by the reverse blocking characteristic of the switch S4, arises in the period C. Therefore, as far as the driver circuit is allowed to have such problems, the switch S4 itself can be eliminated in the configurations of FIG. 8. In a case that the switches S3 and S4 are eliminated in the configuration of FIG. 8, it is preferred that the resistance value of the resistor Rn1 is sufficiently larger than that of the resistor Rr2 (Rr2<<Rr1) thereby to prevent the problem in the period A (erroneous turn-on of the semiconductor switching device M1).

As far as the driver circuit is allowed to have such a problem that the electricity of the capacitor C1 is discharged in the period B, a reverse conducting semiconductor switch may be used as the switch S3 in the above-described configurations. As far as the driver circuit is allowed to have such a problem that the electricity of the capacitor C1 is discharged in the period C, a reverse conducting semiconductor switch may be used as the switch S4 in the above-described configurations.

Figure 9:
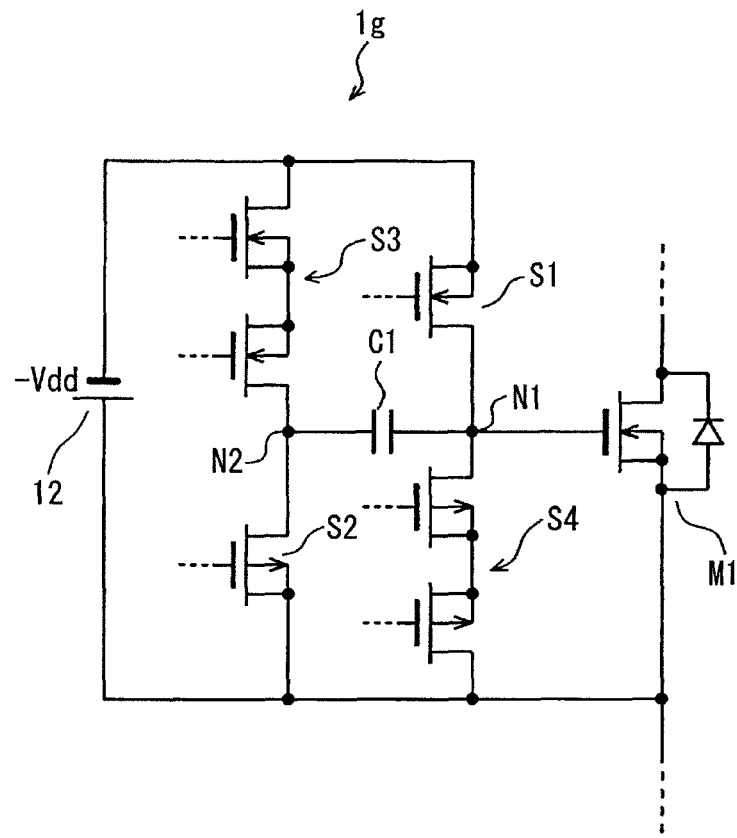
FIG. 9 is a circuit diagram showing a seventh detailed example of the driver circuit.

A driver circuit 1g shown in FIG. 9 is different from the driver circuit 1a shown in FIG. 3 in such points that a drive power source 12 is provided in place of the drive power source 2 and type (P-channel type and N-channel type) of MOSFETs forming the switches S1 to S4 is different. The drive power source 12 is a negative power source, which outputs the negative voltage −Vdd. The switch S1 is an N-channel type MOSFET. The source of the switch S1 is connected to the low-potential side output terminal (corresponding to the other output terminal) of the drive power source 12. The drain of the switch S1 is connected to the node N1. The switch S2 is a P-channel type MOSFET. The source of the switch S2 is connected to the high-potential side output terminal (corresponding to the one output terminal) of the drive power source 12. The drain of the switch S2 is connected to the node N2.

The switch S3 is a bidirectional-conduction type switch formed of two N-channel type MOSFETs which are connected in series and in opposite directions each to the other. The sources of two MOSFETs which form the switch S3 are connected to each other. The drain of one MOSFET of the switch S3 is connected to the low-potential side output terminal of the drive power source 12. The drain of the other MOSFET of the switch S3 is connected to the node N2.

The switch S4 is a bidirectional-conduction type switch formed of two P-channel type MOSFETs which are connected in series and in opposite directions each to the other. The sources of two MOSFETs which form the switch S4 are connected to each other. The drain of one MOSFET of the switch S4 is connected to the node N1. The drain of the other MOSFET of the switch S4 is connected to the high-potential side output terminal of the drive power source 12.

The driver circuit 1g is very advantageous and practical, similarly to the driver circuit 1a shown in FIG. 3, for circuit integration by the CMOS process. The driver circuit 1g applies the negative voltage to the gate of the semiconductor switching device M1 in the period B and applies the positive voltage to the gate of the semiconductor switching device M1 in the period C. In a case that the driver circuit 1g in this configuration drives a normally-on type switching device, it is preferred that the period B is set immediately after the drive power source 2 is turned on. The semiconductor switching device M1 can thus be maintained in the off-state stably. The driver circuit 1g is thus suitable in a case in which the semiconductor switching device M1, which is to be driven, is a normally-on type switching device.

Figure 10:
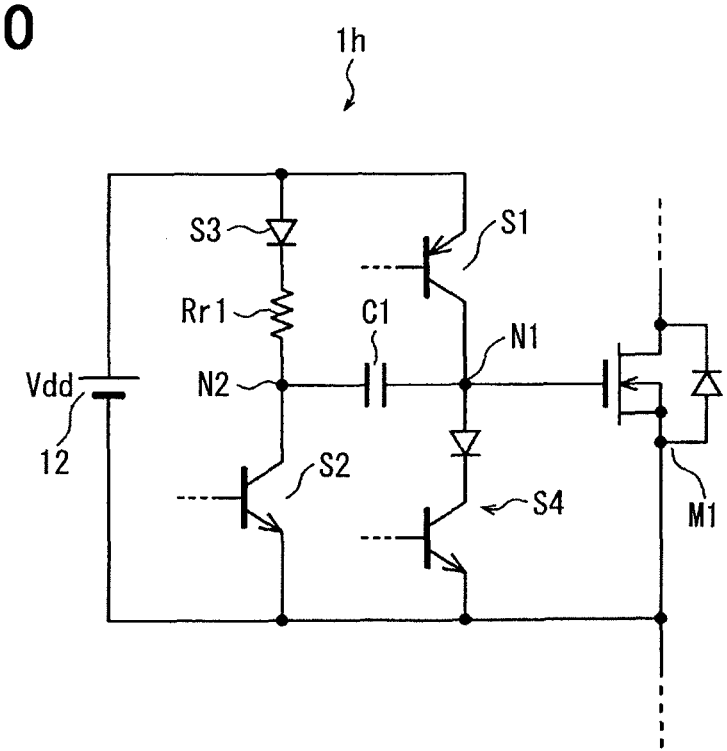
FIG. 10 is a circuit diagram showing an eighth detailed example of the driver circuit.

A driver circuit 1h shown in FIG. 10 is different from the driver circuit 1e shown in FIG. 7 in such points that the switches S1 and S2 are formed of bipolar transistors and the switch S4 is formed of a bipolar transistor and a diode. The switch S1 is a PNP type bipolar transistor. The emitter of the switch S1 is connected to the high-potential side output terminal of the drive power source 2. The collector of the switch S4 is connected to the node N1. The switch S2 is an NPN type bipolar transistor. The emitter of the switch S2 is connected to the low-potential side output terminal of the drive power source 2. The collector of the switch S2 is connected to the node N2.

The switch S4 is formed of an NPN type bipolar transistor and a diode. The cathode of the diode and the collector of the transistor of the switch S4 are connected each other. The anode of the diode of the switch S4 is connected to the node N1. The emitter of the transistor of the switch S4 is connected to the low-potential side output terminal of the drive power source 2. This configuration provides the same operation and advantage as those of the driver circuit 1e shown in FIG. 7. Since the driver circuit 1h shown in FIG. 10 uses the bipolar transistor or the diode as switches S1 to S4, it is suitable for integrating the driver circuit 1h by the bipolar process.

(Second Embodiment)

Figure 11:
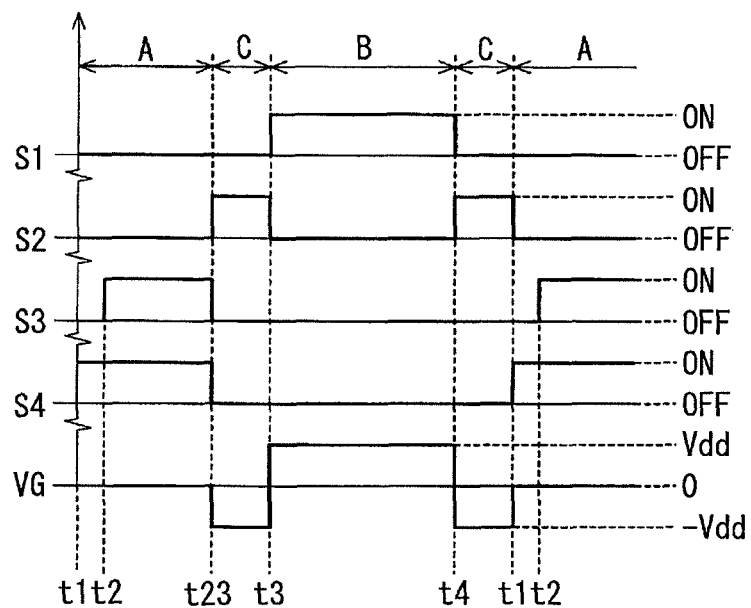
FIG. 11 is a time chart showing an operation of a driver circuit according to a second embodiment in correspondence to FIG. 2.

A second embodiment will be described below with reference to FIG. 11 to FIG. 13. The second embodiment is different from the first embodiment in that the periods A, B and C in one cycle of application of the voltage to the gate of the semiconductor switching device M1 are provided differently. As shown in FIG. 11, the period A (time point t1 to time point t23), the period C (time point t23 to time point t3), the period B (time point t3 to time point t4) and the period C (time point t4 to time point t1) are provided in this order. That is, the period C for applying the negative voltage to the gate to turn off the semiconductor switching device M1 is also provided in advance of the period B, which is for applying the positive voltage to the gate to turn on the semiconductor switching device M1. This configuration prevents the semiconductor switching device M1 from erroneously operating (erroneously turning on) at the time which is immediately before the turning on. This drive method is very advantageous in a case that the semiconductor switching device M1, which is to be driven, is a switch used in a synchronous rectification type chopper. This is for the following reasons.

Figure 12:
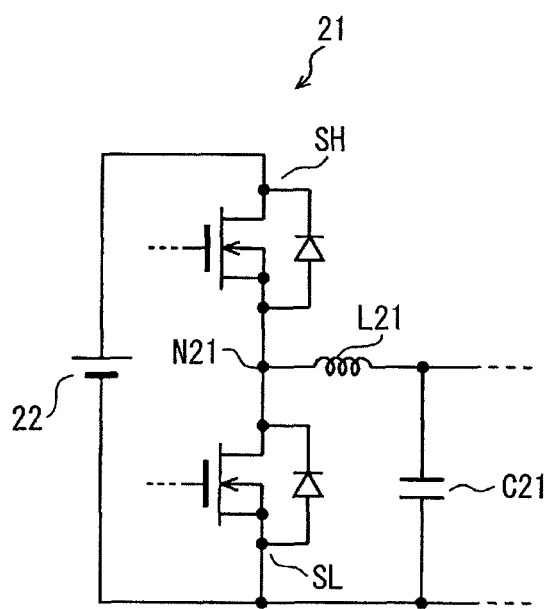
FIG. 12 is a circuit diagram showing one example of a synchronous rectification chopper.

FIG. 12 shows one exemplary configuration of a synchronous rectification type chopper. As shown in FIG. 12, a synchronous rectification type chopper 21 (corresponding to a power conversion circuit) includes a switch SH and a switch SL, which are provided on a high-potential side and a low-potential side of a DC power source 22, respectively, and connected in series between output terminals of the DC power source 22. Between a node N21, at which the switches SH and SL are connected to each other, and the low-potential side output terminal of the DC power source 22, a series circuit of an inductor L21 and a capacitor C21 is connected. In this configuration, at least one of the switches SH and SL is driven by the driver circuit which provides a drive method of the second embodiment.

Figure 13:
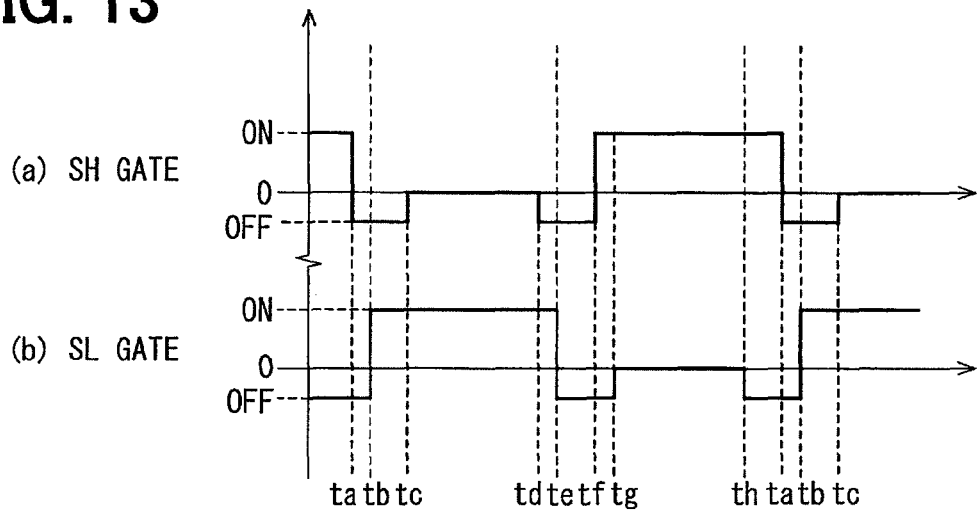
FIG. 13 is a time chart showing one example of operation timing of the synchronous rectification chopper.

As shown in the timing chart of FIG. 13, the switch SH at the high-potential side and the switch SL at the low-potential side are driven alternately in the synchronous rectification type chopper 21. For preventing a short-circuit, in which both of the switches SH and SL are turned on, from arising, a short dead time is provided (period from time point ta to time point tb, and period from time point te to time point tf). Accordingly immediately before the one switch turns on, the other switch turns off. It is thus likely that the switching noise generated by the other switch causes the one switch to turn on erroneously. However, this erroneous operation caused by such switching noise is appropriately suppressed by providing the period C immediately before the period B in addition to following the period B.

(Third Embodiment)

A third embodiment will be described below with reference to FIG. 14 to FIG. 20. In each of the above-described embodiments, the capacitor C1 is used as the charge storage device. However the charge storage device may be any type, as far as it is an element or a circuit which has an electric charge storing function. For example, a charge storage device (battery) may be used in place of the capacitor C1. Further, in place of a single capacitor C1, a circuit having the charge storing function may be used as exemplarily shown in FIG. 14.

A capacitor circuit 31 (corresponding to a storage device) is formed of two capacitors C31 and C32 and three switches S31 to S33 (corresponding to connection-state switchover mechanism). The switch S31 is provided to conduct (close) and shut off (open) a path between one terminal of the capacitor 31 and one terminal of the capacitor 32. The switch 32 is provided to conduct and shut off a path between the other terminals of the capacitors S31 and S32. The switch 33 is provided to conduct and shut off a path between the other terminal of the capacitor 31 and the one terminal of the capacitor 32. Each of the switches S31 to S33 is controllable to turn on and off by a control signal applied from a control circuit, which is not shown. In a case in which the capacitor C1 in the above-described embodiments is replaced with the capacitor circuit 31, the one terminal of the capacitor C31 corresponds to the one terminal of the capacitor C1 and the other terminal of the capacitor C32 corresponds to the other terminal of the capacitor C1.

With this capacitor circuit 31, the following function, which the capacitor C1 cannot realize, can be provided. In the following description, the drive power source is assumed to be the positive power source. However, the same function can be realized even in a case that the negative power source is used. That is, in the period A (third state), in which the switches S3 and S4 are turned on and the switches S1 and S2 are turned off, the switches S31 and S32 are turned on and the switch S33 is turned off. Thus, the capacitors C31 and C32 are connected in parallel to be in a parallel-connection state. Accordingly, in the period A, the capacitor circuit 31 in the parallel-connection state is charged so that both of the capacitors C31 and C32 are charged to the power source voltage Vdd.

In the period C (second state), in which the switch S2 is turned on and the switches S1, S3 and S4 are turned off, the switches S31 and S32 are turned off and the switch S33 is turned on. The capacitors C31 and C32 are thus connected in series to be in a series-connection state. Accordingly, in the period C, the gate of the semiconductor switching device M1 is connected to the low-potential side output terminal of the drive power source 2 through the capacitor circuit 31, which is in the series-connection state. Hence, the gate of the semiconductor switching device M1 is applied with a total voltage of the capacitors C31 and C32, that is, a negative voltage (−2×Vdd) which is twice as large as the power source voltage Vdd.

Thus, it is possible to provide a driver circuit which outputs a negative voltage of twice as large as the power source voltage of the drive power source. If the on/off states of the switches S31 to S33 in the period A and the period C are reversed from the above-described pattern, it is possible to provide a driver circuit which outputs a negative voltage of one-half of the power source voltage of the drive power source.

Figure 14:
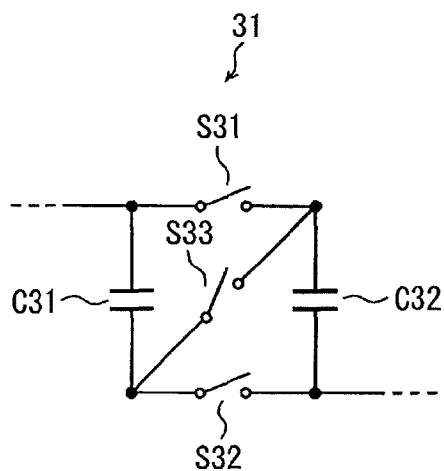
FIG. 14 is a circuit diagram showing one example of a capacitor circuit in a driver circuit according to a third embodiment.

The capacitor circuit 31 shown in FIG. 14 is configured to include two capacitors C31 and C32 and switch over (change) the connection state of the two capacitors C31 and C32 between the series-connection state and the parallel-connection state. Without being limited to this configuration, the number of stages to switch over of the connection state of the capacitors may be increased. As exemplified in a capacitor circuit 32 (corresponding to charge storage device) shown in FIG. 15, it may be formed of three capacitors C31 to C33 and six switches S31 to S36 (corresponding to connection-state switching device). The capacitor circuit 32 operates based on the same principle as the capacitor circuit 31. It is thus possible to provide a driver circuit which outputs a negative voltage of three times as large as the drive power voltage or a negative voltage of one-third as large as the drive power voltage.

Figure 16:
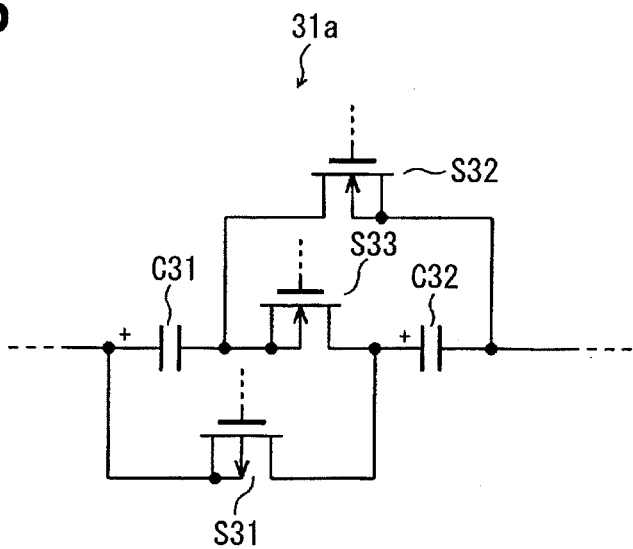
FIG. 16 is a circuit diagram showing a first detailed example of the capacitor circuit.
Figure 17:
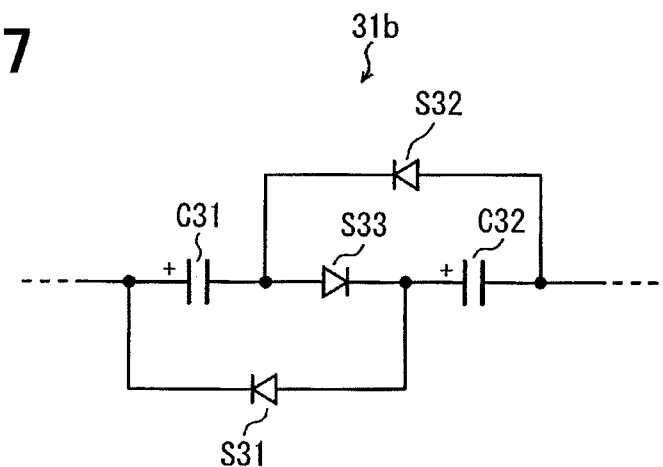
FIG. 17 is a circuit diagram showing a second detailed example of the capacitor circuit.

FIG. 16 and FIG. 17 show examples of details of the capacitor circuit 31 shown in FIG. 14. A capacitor circuit 31a shown in FIG. 16 uses a P-channel type MOSFET as the switch S31 and N-channel type MOSFETs as the switches S32 and S33. The capacitor circuit 31a is therefore suitable for circuit integration by the CMOS process. The capacitor circuit 31b shown in FIG. 17 uses diodes as the switches S31 to S33. The capacitor circuit 31b is therefore suitable for circuit integration by the bipolar process. Since the capacitor circuit 31b uses diodes as the switches S31 to S33, it can be used only in a case of a driver circuit which outputs a negative voltage which is as large as one-half of the drive power voltage. The capacitor circuit 31b is however more advantageous than the capacitor circuit 31a shown in FIG. 16 in that the circuit occupying area is reduced because of use of diodes in place of MOSFETs.

Figure 15:
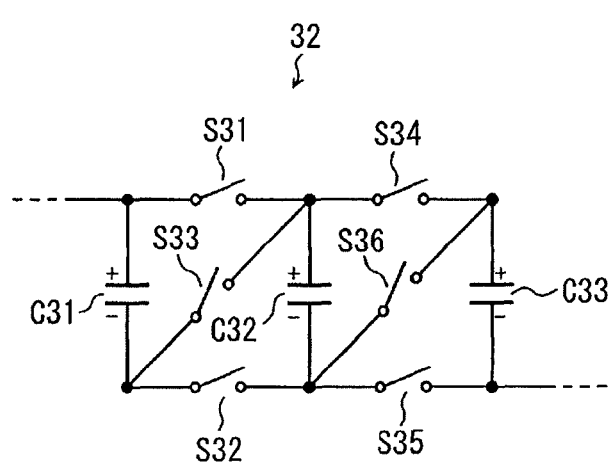
FIG. 15 is a circuit diagram showing another example of the capacitor circuit.
Figure 18:
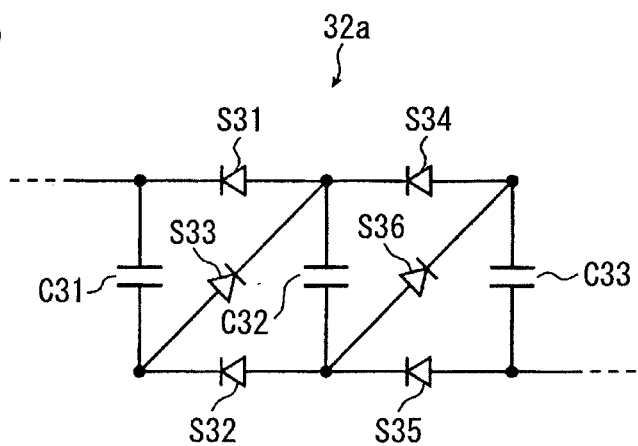
FIG. 18 is a circuit diagram showing a third detailed example of the capacitor circuit.

FIG. 18 shows an example of details of the capacitor circuit 32 shown in FIG. 15. A capacitor circuit 32a shown in FIG. 18 uses diodes as the switches S31 to S36. The capacitor circuit 32 is therefore suitable for circuit integration by the bipolar process. For the same reason as the capacitor circuit 31b shown in FIG. 17, the capacitor circuit 32a can be used only in a case of a driver circuit which outputs a negative voltage of one-third of the drive power voltage.

Figure 19:
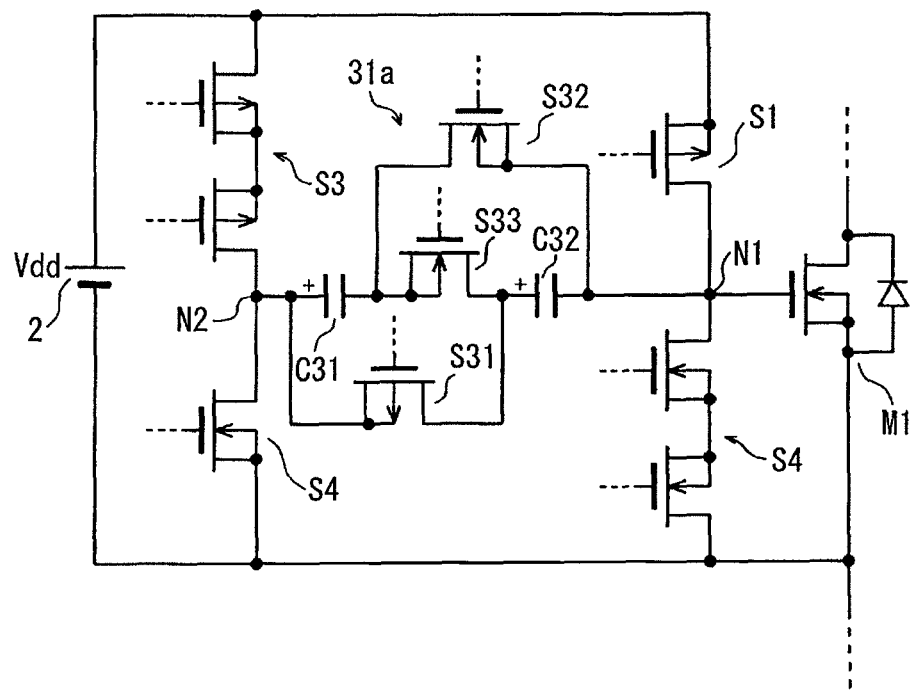
FIG. 19 is a circuit diagram showing a first detailed example of the driver circuit using the capacitor circuit.

FIG. 19 shows an example of details of a driver circuit which uses the capacitor circuit 31a shown in FIG. 16 as the storage device. A driver circuit 33 shown in FIG. 19 is different from the driver circuit 1a shown in FIG. 3 in that the capacitor circuit 31a is used in place of the capacitor C1. In the driver circuit 33, it is possible to apply a negative voltage which is twice as large as or one-half of the voltage Vdd of the drive power source 2, to the gate of the semiconductor switching device M1 in the period C. Since the driver circuit 33 uses MOSFETs for all switches, it is suitable for circuit integration by the CMOS process.

Figure 20:
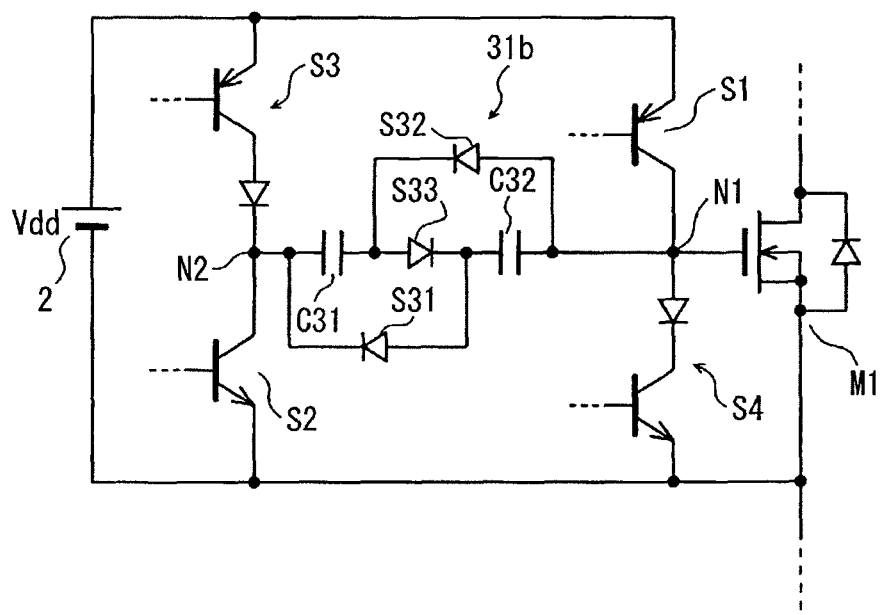
FIG. 20 is a circuit diagram showing a second detailed example of the driver circuit using the capacitor circuit.

FIG. 20 shows an example of details of a driver circuit which uses the capacitor circuit 31b shown in FIG. 17 as the storage device used in place of the capacitor C1. A driver circuit 34 shown in FIG. 20 is different from the driver circuit 1h shown in FIG. 10 in that the capacitor circuit 31b is used in place of the capacitor C1 and the switch S3 is formed of the PNP type bipolar transistor and the diode. In this driver circuit 34, it is possible to apply a negative voltage which is one-half as large as the voltage Vdd of the drive power source 2 to the gate of the semiconductor switching device M1 in the period C.

Since the driver circuit 34 uses the bipolar transistors or diodes for all switches, it is suitable for circuit integration by the bipolar process, As described above, the third embodiment using the capacitor circuits which switch over the connection of plural capacitors between the serial-connection state and the parallel-connection state as the storage device provides the following advantage. That is, it is possible to form a driver circuit which outputs a negative voltage of n-times or 1/n of the drive power voltage (n is the number of stages of serial-parallel change of the capacitor circuit). With the driver circuit which outputs the negative voltage of n-times of the drive power voltage, it is possible to increase tolerance against noise generated when the semiconductor switching device M1 is turned off. That is, even when the switching noise is large or switching is performed at high speeds, it is possible to suppress erroneous operation (erroneous turn-on) at the turn-off time.

With the driver circuit which outputs a negative voltage of 1/n of the drive power voltage, it is possible to suppress deterioration of the gate of the semiconductor switching device M1. That is, some semiconductor switching devices, which are to be driven, has a characteristic that the element (such as a gate oxide film) is deteriorated when a large negative voltage is applied to the gate. With such a configuration which outputs a negative voltage of the drive power voltage, it is possible to suppress the negative voltage to be small and prevent deterioration of the element, while being capable of outputting the positive voltage for turning on.

(Other Embodiments)

The driver circuit is not limited to the embodiments described above and shown in the drawings but may be varied as follows. The order of turning on the switches S1 and S2 and the order of turning on the switches S3 and S4 are not limited to the orders described above, as far as delays in turning on and turning off of the semiconductor switching device M1 are permissible. The on/off control of the switches S1 to S4 are not limited to that shown in FIG. 2 and FIG. 11 but may be varied as follows. That is, it is not necessarily to control shifting of the start time points of the on-periods of the switches S3 and S4. That is, it is possible to control the on-periods of the switches S3 and S4 to be completely identical. It is also possible to control such that the start time point of the on-period of the switch S3 is in advance of that of the switch S4. The arrangement or order of the periods A, B and C are not limited to the arrangement described in the above-described embodiments. The driver circuit is applicable even in cases, in which the periods A to C are varied to arbitrary arrangement or order.

The driver circuit is applicable to drive various power semiconductor switching devices such as a voltage-driven type semiconductor switching device and a current-driven type semiconductor switching device. The voltage-driven type semiconductor switching device is not limited to the power MOSFET formed of GaN-HEMT but may be IGBT and Si-MOSFET. The current-driven type semiconductor switching device may be BJT, GTO (gate turn-off thyristor) and the like. In a case of driving the BJT or IGBT, its base or gate corresponds to a control gate and its emitter corresponds to one current on/off terminal. In a case of driving the GTO, its gate corresponds to a control terminal and its cathode corresponds to one current on/off terminal. Threshold voltages of the above-described elements are not necessarily low. In driving such switching devices particularly under high speed switching, large noises are likely to generate and cause erroneous operation. The driver circuit however appropriately eliminates such an erroneous operation.

In a case in which the driver circuit is integrated, no body diodes parasitizes the switches S1 to S4 formed of MOSFETs only when the potential of the well forming the devices is floated (not connected to a fixed potential). In this case, the switches S1 to S4 may be connected interchanging sources and drains. It is also possible to configure any one of the switches S1 to S4 formed of MOSFETs by interchanging the P-channel type and the N-channel type as far as the polarity of the parasitic body diode of the devices is not changed. In this case, however, it is necessary to input a signal, which is shifted to an appropriate potential level, to the gate of the interchanged devices.

What is claimed is:

1. A driver circuit for driving a semiconductor switching device by applying to a control terminal of the semiconductor switching device a voltage supplied directly or indirectly from a drive power source, the driver circuit comprising:
    a first semiconductor switch having a function of conducting and shutting off a current of at least one direction;
    a second semiconductor switch having a function of conducting and shutting off a current of at least one direction; and
    a storage device having a charge storage function and chargeable by the drive power source through a first charge path and a second charge path, wherein
    one output terminal of the drive power source is connected to one current on/off terminal of the semiconductor switching device,
    the first semiconductor switch is provided in a path, which connects the other output terminal of the drive power source and the control terminal,
    the storage device is provided in a path, which connects the control terminal and one terminal of the second semiconductor switch,
    the second semiconductor switch is connected in a path, which connects the storage device and the one output terminal of the drive power source,
    the first charge path is a current supply path, which connects the other output terminal of the drive power source and the control terminal through the storage device,
    the second charge path is a current supply path, which connects the control terminal and the one output terminal of the drive power source,
    a voltage is applied to the control terminal of the semiconductor switching device in each cycle of voltage application,
    the cycle includes a first state of turning on the first semiconductor switch and turning off the second semiconductor switch and a second state of turning off the first semiconductor switch and turning on the second semiconductor switch, and
    the cycle further includes a third state of turning off the first semiconductor switch and the second semiconductor switch at least once in a predetermined period, which includes a period of application of the voltage to the control terminal of the semiconductor switching device.

2. The driver circuit according to claim 1, wherein:
    one or both of the first charge path and the second charge path has a function of conducting a charge current for the storage device and shutting off a current of a reverse direction.

3. The driver circuit according to claim 1, wherein:
    one or both of the first charge path and the second charge path is provided with an on/off switch for turning on and off a charge current for the storage device; and the on/off switch is turned off in the first state and the second state and turned on in the third state.

4. The driver circuit according to claim 3, wherein:
each of the first charge path and the second charge path is provided with the on/off switch, which conducts and shuts off the charge current for the storage device; and
when the on/off switch of the first charge path and the on/off switch of the second charge path are turned on for transition to the third state, the on/off switch of the second charge path is turned on before the on/off switch of the first charge path is turned on.

5. The driver circuit according to claim 3, wherein:
the on/off switch provided in each of the first charge path and the second charge path is formed of a series-connected two MOSFETs, which are capable of switching currents in opposite directions to each other and are connected in series to each other.

6. The driver circuit according to any one of claim 1, wherein:
an on-resistance of the second charge path is lower than that of the first charge path.

7. The driver circuit according to claim 1, wherein:
the storage device is a capacitor.

8. The driver circuit according to claim 1, wherein:
the storage device includes plural capacitors and a connection-state switchover mechanism, which switches over connection-states between a series-connection state and a parallel-connection state, in which the capacitors are connected in series and in parallel, respectively; and
the connection state switchover mechanism switches over the connection-states of the capacitors so that the connection-state of the capacitors in the second state and the connection-state of the capacitors in the third state are different from each other.

9. The driver circuit according to claim 1, wherein:
the third state is provided in each cycle of application of the voltage to the control terminal of the semiconductor switching device.

10. The driver circuit according to claim 1, wherein:
the second state is provided immediately following the first state; and
the third state is provided in a period, which is after the second state continues for a predetermined time.

11. The driver circuit according to claim 1, wherein:
the second state is provided immediately preceding the first state.

12. The driver circuit according to claim 1, wherein:
the other output terminal of the drive power source is a high-potential side output terminal;
the first semiconductor switch is a P-channel type MOSFET, which has a source connected to the other output terminal of the drive power source; and
the second semiconductor switch is an N-channel type MOSFET, which has a source connected to the one output terminal of the drive power source.

13. The driver circuit according to claim 1, wherein:
the other output terminal of the drive power source is a low-potential side output terminal;
the first semiconductor switch is an N-channel type MOSFET, which has a source connected to the other output terminal of the drive power source; and
the second semiconductor switch is a P-channel type MOSFET, which has a source connected to the one output terminal of the drive power source.

* * * * *